United States Patent [19]

Fowks

[11] 4,446,446
[45] May 1, 1984

[54] PROGRAMMABLE FREQUENCY SYNTHESIZER PRIMARILY FOR USE IN AN ATOMIC CLOCK

[75] Inventor: William R. Fowks, Yorba Linda, Calif.

[73] Assignee: Rockwell International Corporation, El Segundo, Calif.

[21] Appl. No.: 284,039

[22] Filed: Jul. 17, 1981

[51] Int. Cl.³ .......................... H03L 7/18; H03L 7/26
[52] U.S. Cl. ............................................. 331/3; 331/8; 331/16; 331/25; 331/36 C; 331/94.1; 331/117 FE; 331/117 V
[58] Field of Search ................... 331/3, 94.1, 8, 16, 331/18, 25, 36 C

[56] References Cited

U.S. PATENT DOCUMENTS

| | | | |
|---|---|---|---|
| 4,249,138 | 2/1981 | Bell | 331/18 X |
| 4,314,208 | 2/1982 | Munday | 331/25 X |

OTHER PUBLICATIONS

Anon., "Rubidium Frequency Standard 5065A," Specification Sheet, Hewlett–Packard, Mar. 1968.

Primary Examiner—Siegfried H. Grimm
Assistant Examiner—W. R. Paxman
Attorney, Agent, or Firm—H. Fredrick Hamann; Richard A. Bachand

[57] ABSTRACT

An adjustable frequency synthesizer primarily for use in an atomic frequency standard of the type used for stabilizing a frequency source by locking it to the hyperfine transition resonance of an atomic frequency resonator. The synthesizer is programmable by an externally applied code to provide the proper frequency, electromagnetic resonance field to the atomic frequency resonator. The synthesizer also provides a phase locked frequency modulating signal to produce the resonance deviation signal in the resonator. The broad range and fine frequency increments of the synthesizer permit accommodation of a wide range of resonance frequencies in the atomic frequency resonator to obviate resonator gas pressure and magnetic field variations which would otherwise decrease the production yield of such resonators.

20 Claims, 4 Drawing Figures

PROGRAMMABLE FREQUENCY SYNTHESIZER PRIMARILY FOR USE IN AN ATOMIC CLOCK

BACKGROUND OF THE INVENTION

1. Field of the Invention

The present inventions relates to atomic stabilized frequency sources and more particularly to an improved adjustable frequency synthesizer adapted for use with such sources.

2. Prior Art

Although the present invention may find practical application in any one of the numerous atomic stabilized frequency sources, it is particularly adaptable for operation in a rubidium vapor cell frequency standard. Rubidium vapor cell frequency standards, as well as other types of atomic stabilized frequency sources, are described extensively in the literature. For example, reference may be had to the texts respectively entitled, "Frequency and Time" by P. Kartaschoff, Academic Press, 1978, and "Frequency Synthesizers Theory and Design", Second Edition, by Vadim Manassewitsch, John Wiley and Sons, 1980. Such frequency sources are stabilized by quantum mechanical atomic state transition resonances such as the hyperfine atomic resonant frequency related to the change in the internal energy of the atom. A rubidium frequency standard operates as a discriminator based upon the energy absorption characteristic of rubidium-87. In practice a rubidium lamp passes a light beam into a rubidium absorption cell. The ribidium cell absorbs some of the light energy because of the energy level transitions in the rubidium-87 gas. When an electromagnetic field of frequency equal to the resonant frequency of the rubidium vapor is applied to the vapor cell, the number of energy level transitions in the rubidium-87 gas is increased and more of the light emitted by the rubidium lamp is absorbed in the rubidium vapor cell. Typically, a photodiode is used to detect the occurrence of the maximum absorption of light from the rubidium lamp which occurs when the frequency of the exictation electromagnetic field exactly matches the rubidium resonant frequency. Typically, a frequency synthesizer is used to generate the appropriate electromagnetic field frequency of approximately 6,834.685 MHz. This field is frequency modulated at a relatively slow rate (i.e., 154 Hz.) so that the photodiode provides a demodulated signal which may be applied to a phase detector or comparator which also receives the reference modulation signal. The output of the phase comparator is a DC error voltage which is used to control a voltage controlled crystal oscillator at a selected frequency, typically of 5 or 10 MHz. In this manner, the frequency of the crystal oscillator is stabilized approximately to one part per $10^{11}$ or better over long periods of time to provide a highly stable and accurate frequency source.

Usually, because of variations in the precise gas pressure within the rubidium vapor cell, or variations in the quantity of rubidium gas relative to carrier gases that are mixed with the rubidium gas to achieve desired temperature insensitivity, the hyperfine transition resonance frequency of the optically pumped absorption cell varies to some extent from cell to cell. As a consequence, in those prior art rubidium frequency standards in which a fixed frequency synthesizer is used to develop the electromagnetic excitation field applied to the cell, it is necessary to vary the resonance frequency of the cell by altering the pressure of the gases in the cell. Although some resonance frequency variation may be achieved by changing the intensity of a magnetic field applied to the cell, the extent to which variation may be achieved in this manner is usually very limited and it is generally impractical to provide sufficient adjustment of the resonance frequency to accommodate the fixed frequency of the electromagnetic field using only the magnetic field. As a consequence thereof, some manufacturers of rubidium frequency standards utilize an iterative process of finely adjusting the gas pressure by dimpling or otherwise changing the geometry of the gas cell structure, each time rechecking the resonance frequency of the cell. Unfortunately, this iterative process is time consuming and expensive and often results in a substantial reduction of cell production yield because of the irreversible nature of the dimpling process and the high risk of physical damage to the cell structure.

Although there are prior art references which disclose rubidium frequency standards employing frequency synthesizers of which the output frequency may be varied over some limited range, the adjustability of such synthesizers is primarily intended for an alternative purpose and therefore does not provide the requisite degree of variation needed to assure 100% cell yield due to moderate variations in gas pressure and mixture content as noted above. For example, there are those applications in which the frequency stable signal provided by the frequency source serves as a measure of time relative to the current ephemeris time scale. In such applications it is desireable to periodically change the ephemeris time scale which does not remain fixed relative to earth rotation. Consequently, it is necessary to adjust the output frequency of the atomic clock frequency standard in order to maintain an accurate measure of time. One way of adjusting the output frequency of the atomic clock frequency standard, without the replacement or modification of resonator parts, is to provide a variable frequency synthesizer which permits maintaining the hyperfine transition resonance center frequency of the atomic frequency standard by instead altering the frequency of the crystal controlled oscillator relative to the resonant center frequency of the standard. However, the frequency offset necessary to accommodate time scale changes for earth time correction need only be on the order of a fraction of a Hz. As a result, such prior art adjustable frequency synthesizers used with rubidium frequency standards tend to have extremely limited ranges which cannot accommodate larger deviations in cell resonance frequency. Furthermore, such prior art adjustable frequency synthesizers tend to be very complex and therefore unreliable and often require a plurality of adjustments to achieve the desired offset frequency. Often such prior art standards still require some adjustment of the magnetic field because of inadequate resolution of the frequency synthesizer increments or because of the complexity of the synthesizer adjustment which renders adjustment of the magnetic field more desirable.

The most relevant prior art known to the applicant is disclosed in U.S. Pat. No. 3,363,193 to Arnold; U.S. Pat. No. 3,408,591 to Helgesson; and in the Hewlett Packard manual entitled "Rubidium Vapor Frequency Standard 5065A" published by the Hewlett Packard Company in February 1970. The Arnold patent discloses an adjustable synthesizer with an offset frequency adjustment range of only + or −204 Hz. and which requires a plurality of manual adjustments including use of a four-pole, seven-position switch. The patent to Helgesson, although disclosing a synthesizer of somewhat broader range, (i.e. + or −1400 Hz.) utilizes a very complex phase-to-voltage converter locking circuit which is inherently unreliable. As a result thereof, Helgesson's synthesizer requires special alarm circuits to indicate an unlocked or false locked condition which would otherwise adversely affect the accuracy of the offset frequency setting. In addition, in order to achieve even the limited range disclosed in that patent it is apparently necessary to change crystals in the voltage controlled crystal oscillator; a highly undesirable inconvenience.

Frequency offset in the Hewlett Packard apparatus is accomplished by a plurality of manual adjustments including the setting of four thumbwheel switches and that apparatus still only provides a total offset range of about 684 Hz.. Furthermore the manufacture specifies a preference for controlling frequency offset by varying the magnetic field, resorting to electronically changing the offset frequency only when the magnetic field variation is inadequate to accomplish the desired offset.

Furthermore, it is to be noted that prior art frequency synthesizers used in rubidium frequency standards serve the sole purpose of controlling the precise frequency of electromagnetic field applied to the rubidium vapor cell. Accordingly, a separate oscillator must be used to phase modulate the output signal of the voltage controlled crystal oscillator to provide the requisite error signal detected by the photodiode which is then used to develop the DC signal to control the crystal oscillator within the feedback loop previously noted. The use of a separate modulation oscillator introduces some risk of error in detecting the precise rubidium cell resonance frequency. Furthermore, phase modulation makes it difficult to measure the resultant modulation at the very high frequency of the applied electromagnetic field because it is difficult to see the deviation at lower frequencies closer to the unmultiplied output of the voltage controlled crystal oscillator.

SUMMARY OF THE INVENTION

The present invention provides an improved adjustable frequency synthesizer primarily for use in rubidium frequency standards. The synthesizer of the present invention provides high range digital control which permits compensation for rubidium vapor cell resonance frequency variations, obviates the prior art requirement for varying gas pressures and/or gas mixtures, while still providing superior resolution of frequency offset increments for precise control of the desired frequency offset for virtually any application and without requiring adjustment of the magnetic field applied to the gas cell. In the present invention the modulating frequency is generated within the frequency synthesizer and directly frequency modulates the frequency synthesizer output signal to provide a peak-to-peak frequency deviation which is easily measured and controlled. Consequently, in the present invention the modulation frequency and deviation stability is assured by the inherent stability of the phase lock loop of the synthesizer. Furthermore, the present invention provides a frequency synthesizer of reduced complexity and number of components to provide increased reliability. In the disclosed embodiment, this reduction in complexity and components is achieved by employing a combination of CMOS, TTL, and BIPOLAR technologies. In addition, the invention provides for remote frequency programming to control the synthesizer frequency.

Consequently, as a result of the novel improvements herein disclosed it will be seen that it is now possible by means of the present invention to provide a rubidium frequency standard in which usual production variations in vapor cell resonance frequency may be compensated for electrically in the synthesizer without requiring iterative production processes for varying the mechanical characteristics of the cell. The invention also provides means for automating the control of the frequency offset characteristic of the standard by which changes in the time scale of the standard may be periodically adjusted by computer for making earth time corrections.

OBJECTS

It is therefore a primary object of the present invention to provide a rubidium frequency standard which incorporates an improved programmable frequency synthesizer that overcomes and/or substantially reduces the aforementioned disadvantages of the prior art.

It is another object of the present invention to provide an improved adjustable frequency synthesizer for use in atomic frequency standard devices and providing frequency offset variations of such devices over a range of approximately 5000 Hz. and in increments of less than 20 Hz.

It is still an additional object of the present invention to provide an improved variable frequency synthesizer primarily for use in a rubidium frequency standard and having a range sufficient to obviate any requirement for adjusting the electromagnetic frequency resonance of the rubidium gas cell incorporated therein and precluding the need for variation of the aforementioned resonance frequency by variations of the magnetic field applied thereto.

It is still a further object of the present invention to provide an improved variable frequency synthesizer for use in a rubidium frequency standard and having programmable means adapted for automated control, such as by a programmed computer, of the offset frequency thereof whereby preselected periodic time scale changes may be readily accomplished.

It is still a further object of the present invention to provide an improved frequency synthesizer for use in a rubidium frequency standard and including means for deriving an error modulating signal thereof and for applying such modulating signal to the synthesizer output signal for frequency modulation thereof.

It is still an additional object of the present invention to provide an improved variable frequency synthesizer for use in a rubidium frequency standard having a reduced number of components and resultant increase in reliability by combining a plurality of semiconductor technologies.

BRIEF DESCRIPTION OF THE DRAWINGS

The aforementioned objects and advantages of the present invention, as well as additional objects and advantages thereof, will be more fully understood hereinafter as a result of the detailed description of the presently preferred embodiment of the invention when taken in conjunction with the accompanying drawings in which:

FIG. 3, comprising

DETAILED DESCRIPTION OF A PREFERRED EMBODIMENT

Figure 1:
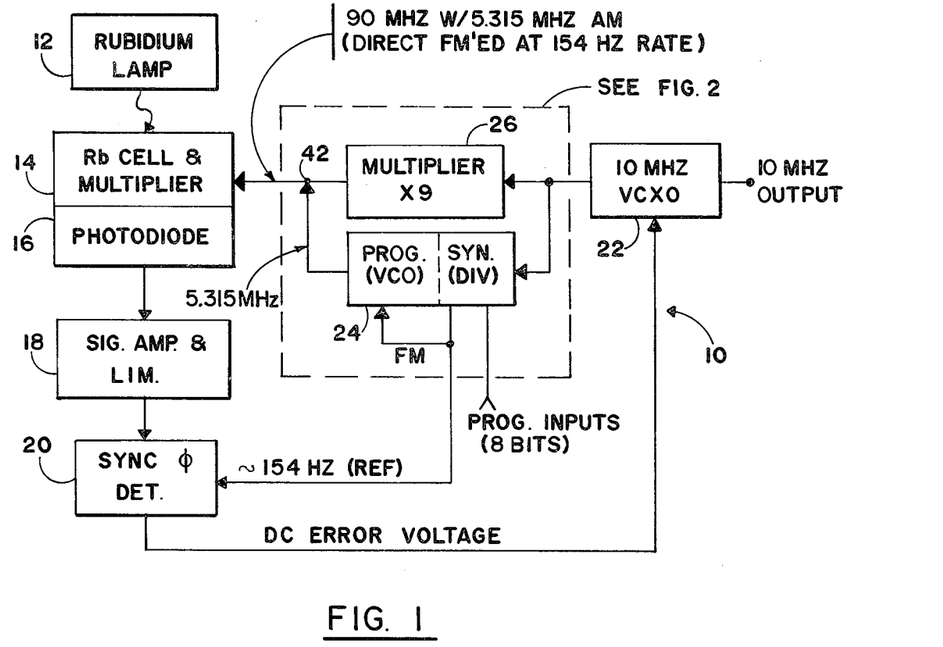
FIG. 1 is a simplified block diagram of a rubidium frequency standard in which the improved variable frequency synthesizer of the present invention may be utilized.

Referring to FIG. 1 there is shown a simplified block diagram of a rubidium frequency standard 10 employing a programmable frequency synthesizer in accordance with the present invention. More specifically, and as is well known in the art, the rubidium frequency standard 10 utilizes a rubidium lamp 12 to generate a beam of light. The light beam is directed through a rubidium vapor cell and multiplier 14 and is incident upon a photodiode 16. The output of the photodiode is connected to a signal amplifier and limiter 18 which is, in turn, connected to a synchronous phase detector 20. Synchronous phase detector 20 develops a DC error voltage in a manner to be more fully explained hereinafter which is applied to a 10 MHz. voltage controlled crystal oscillator 22 to adjust the precise frequency thereof. Crystal oscillator 22 provides a nominal 10 MHz. output signal which is the externally accessible output of the rubidium frequency source 10. Crystal oscillator 22 also provides output signals to the programmable frequency synthesizer 24 of the present invention and to a X9 frequency multiplier 26.

Synthesizer 24 generates a phase locked 154 Hz. squarewave signal that is applied as a reference signal to synchronous phase detector 20 and which is also applied as a frequency modulating signal to a phase locked voltage controlled oscillator internal to the synthesizer. The output of this internal voltage controlled oscillator is a sinewave signal of approximately 5.315 MHz. which is summed with the 90 MHz. output signal of multiplier 26. That combination of signals is applied to rubidium cell and multiplier 14. The lower sideband of the 76th harmonic of the 90 MHz. signal output of multiplier 26, (amplitude modulated by the 5.315 MHz. output of the synthesizer), generated by the non-linear characteristic of a snap diode multiplier, corresponds to the approximate resonance frequency of the hyperfine atomic state transition of the rubidium cell.

As is well known in the art to which the present invention pertains, when the frequency of the applied electromagnetic field matches the resonance frequency of the rubidium cell, the maximum number of energy transitions occur and the maximum absorption of rubidium-87 light is produced in the rubidium cell. Accordingly, the effect of the 154 Hz. frequency modulation of the lower sideband of the 90 MHz. output of multiplier 26, amplitude modulated by the 5.315 MHz. output of the synthesizer 24, is a photodiode output signal which is composed of a combination of 154 Hz. fundamental frequency and a second harmonic at a frequency of 308 Hz. As is well known in the art, when the resonant frequency of the rubidium cell is matched precisely by the frequency of the applied electromagnetic radiation, the fundamental modulation frequency of 154 Hz. is, in effect, zeroed out and only the 308 Hz. second harmonic remains. On the other hand, if precise matching of the frequency of the electromagnetic radiation and the resonance of the cell is not achieved, the fundamental modulation frequency at 154 Hz. is produced by the photodiode and with a phase dependent upon whether the frequency of the applied electromagnetic radiation is above or below the resonance frequency of the cell. The photodiode output signal is applied to the signal amplifier and limiter 18 and thereafter to synchronous phase detector 20. Detector 20 compares the photodiode output with a 154 Hz. reference signal derived from frequency synthesizer 24. The detector thus provides a DC error voltage, the magnitude and polarity of which may be used to accurately track the frequency of the 10 MHz. voltage controlled crystal oscillator 22 to the resonance frequency of the rubidium cell.

As further indicated in FIG. 1, the programmable frequency synthesizer 24 of the present invention, includes provision for programmable inputs comprising 8-bits of binary code for controlling the frequency thereof. Furthermore, the synthesizer of the present invention provides the 154 Hz. reference signal to synchronous phase detector 20 to develope the DC error signal applied to the crystal oscillator 22. It also provides means for directly frequency modulating an internal VCO for developing the frequency modulated 5.315 MHz. signal that is summed with the output of multiplier 26 and eventually used to derived the precise electromagnetic field frequency applied to the rubidium cell and multiplier 14. A more detailed description of the operation of the programmable frequency synthesizer 24 in conjunction with multiplier 26 and voltage controlled oscillator 22 is now provided in conjunction with FIG. 2.

Figure 2:
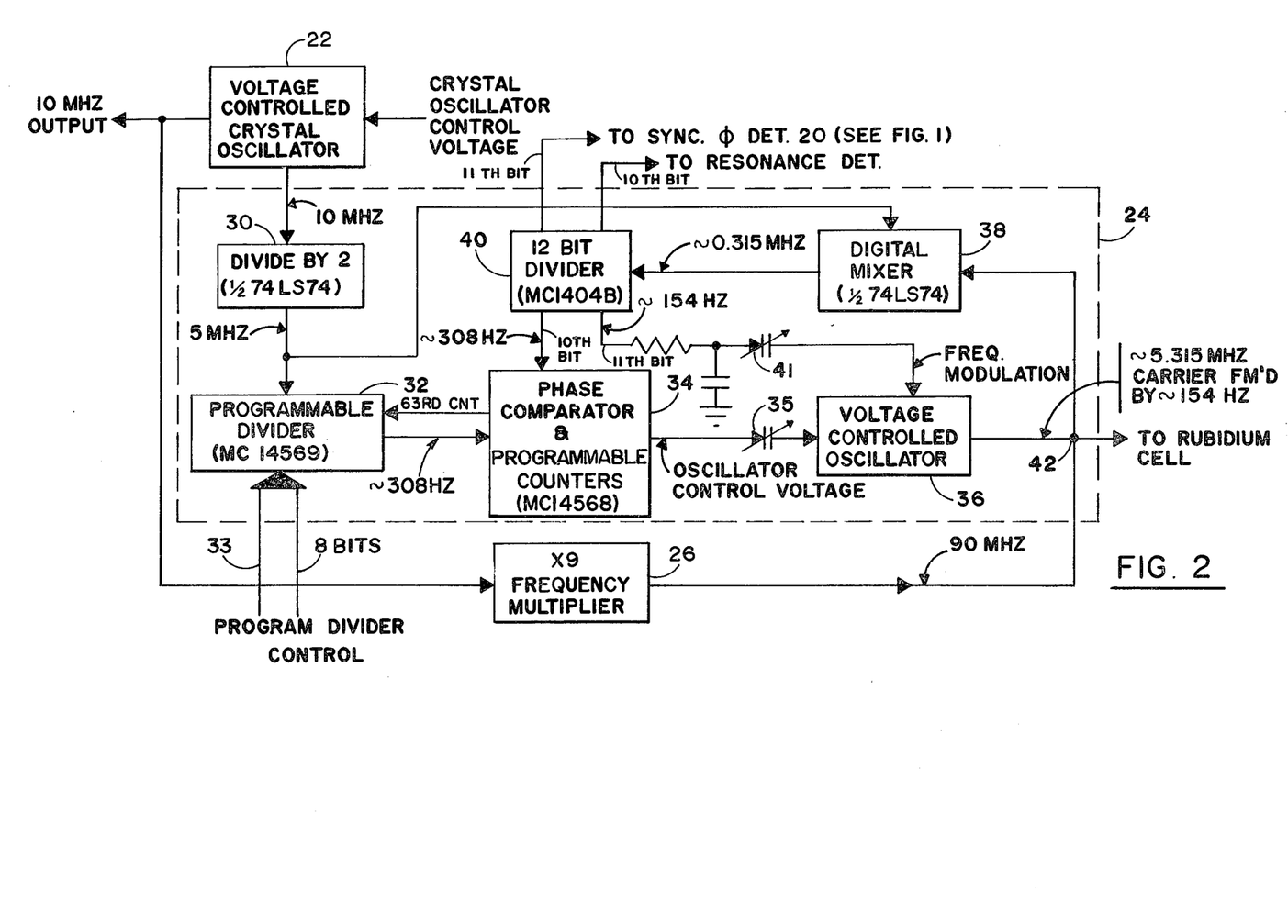
FIG. 2 is a block diagram of the variable frequency synthesizer of the invention also illustrating the interconnection thereof with a frequency mutliplier and voltage controlled crystal oscillator employed in the rubidium frequency standard with which the invention may be used.

As shown in FIG. 2, variable frequency synthesizer 24 comprises a divide-by-2 circuit 30, a programmable divider 32, a phase comparator and programmable counters circuit 34, a variable capacitor 35, a voltage controlled oscillator 36, a digital mixer 38, a 12-bit divider 40 and a variable capacitor 41. Divide-by-2 circuit 30 comprises a flip flop such as one half of a model 74LS74 dual flip flop chip. Circuit 30 receives a 10 MHz. signal from voltage controlled crystal oscillator 22 and generates a 5 MHz. signal therefrom. This 5 MHz. signal is applied to programmable divider 32 which, in the preferred embodiment of the invention illustrated herein, comprises a Motorola Model MC14569B high speed programmable divide by N dual 4-bit BCD/binary counter.

Programmable divider 32 is connected in cascade with phase comparator and programmable counters circuit 34 which, in the preferred embodiment of the invention, comprises a Motorola Model MC14568B phase comparator and programmable counters chip. Programmable divider 32 repeatedly divides the incoming 5 MHz. signal by 256. Each such division is counted by the programmable counters portion of circuit 34. When the incoming 5 MHz. has been divided by 256 a total of 63 times in programmable divider 32, phase comparator and programmable counters chip 34 transmits a signal back to programmable divider 32 indicating that the next or 64th division process in that sequence is to divide the incoming 5 MHz. signal by the programmed divisor P. P is programmed into programmable divider 32 in accordance with the 8-bits of binary code applied to program divider control bus 33. The combination of programmable divider 32 and the programmable counters portion of chip 34 results in a combined division process by a factor equal to 63×256 plus P or 16128+P. The divisor P may be any number from 0 to 255 corresponding to the 8-bit binary code.

Table I provides a listing of all synthesizer frequencies and coresponding electromagnetic field frequencies at cell resonance for P=0 to 255.

TABLE I

| P | SYN FREQ | CELL FREQ |
|---|---|---|
| 0 | 5317460 | 6834682540 |
| 1 | 5317441 | 6834682559 |
| 2 | 5317421 | 6834682580 |
| 3 | 5317401 | 6834682599 |
| 4 | 5317382 | 6834682618 |
| 5 | 5317362 | 6834682638 |
| 6 | 5317342 | 6834682648 |
| 7 | 5317323 | 6834682677 |
| 8 | 5317303 | 6834682697 |
| 9 | 5317283 | 6834682717 |
| 10 | 5317264 | 6834682736 |
| 11 | 5317244 | 6834682756 |
| 12 | 5317224 | 6834682776 |
| 13 | 5317205 | 6834682795 |
| 14 | 5317185 | 6834682815 |
| 15 | 5317165 | 6834682835 |
| 16 | 5317146 | 6834682854 |
| 17 | 5317126 | 6834682874 |
| 18 | 5317106 | 6834682894 |
| 19 | 5317087 | 6834682913 |
| 20 | 5317067 | 6834682933 |
| 21 | 5317048 | 6834682953 |
| 22 | 5317028 | 6834682972 |
| 23 | 5317008 | 6834682992 |
| 24 | 5316989 | 6834683011 |
| 25 | 5316969 | 6834683031 |
| 26 | 5316949 | 6834683051 |
| 27 | 5316930 | 6834683070 |
| 28 | 5316910 | 6834683090 |
| 29 | 5316891 | 6834683109 |
| 30 | 5316871 | 6834683129 |
| 31 | 5316851 | 6834683149 |
| 32 | 5316832 | 6834683168 |
| 33 | 5316812 | 6834683188 |
| 34 | 5316792 | 6834683208 |
| 35 | 5316773 | 6834683227 |
| 36 | 5316753 | 6834683247 |
| 37 | 5316734 | 6834683266 |
| 38 | 5316714 | 6834683286 |
| 39 | 5316694 | 6834683306 |
| 40 | 5316675 | 6834683325 |
| 41 | 5316655 | 6834683345 |
| 42 | 5316636 | 6834683364 |
| 43 | 5316616 | 6834683384 |
| 44 | 5316597 | 6834683403 |
| 45 | 5316577 | 6834683423 |
| 46 | 5316557 | 6834683443 |
| 47 | 5316638 | 6834683462 |
| 48 | 5316518 | 6834683482 |
| 49 | 5316499 | 6834683501 |
| 50 | 5316479 | 6834683521 |
| 51 | 5316460 | 6834683540 |
| 52 | 5316440 | 6834683560 |
| 53 | 5316420 | 6834683580 |
| 54 | 5316401 | 6834683599 |
| 55 | 5316381 | 6834683619 |
| 56 | 5316362 | 6834683638 |
| 57 | 5316342 | 6834683658 |
| 58 | 5316323 | 6834683677 |
| 59 | 5316303 | 6834683697 |
| 60 | 5316284 | 6834683716 |
| 61 | 5316264 | 6834683736 |
| 62 | 5316245 | 6834683755 |
| 63 | 5316225 | 6834683775 |
| 64 | 5316206 | 6834683794 |
| 65 | 5316186 | 6834683814 |
| 66 | 5316166 | 6834683834 |
| 67 | 5316147 | 6834683853 |
| 68 | 5316127 | 6834683873 |
| 69 | 5316108 | 6834683892 |
| 70 | 5316088 | 6834683912 |
| 71 | 5316069 | 6834683931 |
| 72 | 5316049 | 6834683951 |

TABLE I-continued

| P | SYN FREQ | CELL FREQ |
|---|---|---|
| 73 | 5316030 | 6834683970 |
| 74 | 5316010 | 6834683990 |
| 75 | 5315591 | 6834684009 |
| 76 | 5315971 | 6834684029 |
| 77 | 5315952 | 6834684048 |
| 78 | 5315932 | 6834684068 |
| 79 | 5315913 | 6834684087 |
| 80 | 5315893 | 6834684107 |
| 81 | 5315874 | 6834684126 |
| 82 | 5315854 | 6834684146 |
| 83 | 5315835 | 6834684165 |
| 84 | 5315815 | 6834684185 |
| 85 | 5315796 | 6834684204 |
| 86 | 5315776 | 6834684224 |
| 87 | 5315757 | 6834684243 |
| 88 | 5315738 | 6834684262 |
| 89 | 5315718 | 6834684282 |
| 90 | 5315699 | 6834684301 |
| 91 | 5315679 | 6834684321 |
| 92 | 5315550 | 6834684340 |
| 93 | 5315640 | 6834684360 |
| 94 | 5315621 | 6834684379 |
| 95 | 5315601 | 6834684399 |
| 96 | 5315582 | 6834684418 |
| 97 | 5315562 | 6834684438 |
| 98 | 5315543 | 6834684457 |
| 99 | 5315524 | 6834684476 |
| 100 | 5315504 | 6834684496 |
| 101 | 5315485 | 6834684515 |
| 102 | 5315465 | 6834684535 |
| 103 | 5315446 | 6834684554 |
| 104 | 5315426 | 6834684574 |
| 105 | 5315407 | 6834684593 |
| 106 | 5315387 | 6834684613 |
| 107 | 5315368 | 6834684632 |
| 108 | 5315349 | 6834684541 |
| 109 | 5315329 | 6834684671 |
| 110 | 5315310 | 6834684690 |
| 111 | 5315290 | 6834684710 |
| 112 | 5315271 | 6834684729 |
| 113 | 5315252 | 6834684748 |
| 114 | 5315232 | 6834684768 |
| 115 | 5315213 | 6834684787 |
| 116 | 5315193 | 6834684807 |
| 117 | 5315174 | 6834684826 |
| 118 | 5315155 | 6834684846 |
| 119 | 5315135 | 6834684865 |
| 120 | 5315116 | 6834684884 |
| 121 | 5315096 | 6834684904 |
| 122 | 5315077 | 6834684923 |
| 123 | 5315058 | 6834684942 |
| 124 | 5315038 | 6834684962 |
| 125 | 5315019 | 6834684981 |
| 126 | 5314999 | 6834685001 |
| 127 | 5314980 | 6834685020 |
| 128 | 5314961 | 6834685039 |
| 129 | 5314941 | 6834685059 |
| 130 | 5314922 | 6834685078 |
| 131 | 5314903 | 6834685097 |
| 132 | 5314883 | 6834685117 |
| 133 | 5314864 | 6834685136 |
| 134 | 5314844 | 6834685156 |
| 135 | 5314825 | 6834685175 |
| 136 | 5314806 | 6834685194 |
| 137 | 5314786 | 6834685214 |
| 138 | 5314767 | 6834685233 |
| 139 | 5314748 | 6834685252 |
| 140 | 5314728 | 6834685272 |
| 141 | 5314709 | 6834685291 |
| 142 | 5314690 | 6834685310 |
| 143 | 5314670 | 6834685330 |
| 144 | 5314651 | 6834685349 |
| 145 | 5314632 | 6834685368 |
| 146 | 5314612 | 6834685388 |
| 147 | 5314593 | 6834685407 |
| 148 | 5314574 | 6834685426 |
| 149 | 5314554 | 6834685446 |
| 140 | 5314435 | 6834685465 |
| 151 | 5314516 | 6834685484 |
| 152 | 5314496 | 6834685504 |
| 153 | 5314477 | 6834685523 |

TABLE I-continued

| P | SYN FREQ | CELL FREQ |
|---|---|---|
| 154 | 5314458 | 6834685542 |
| 155 | 5314438 | 6834685562 |
| 156 | 5314419 | 6834685581 |
| 157 | 5314400 | 6834685600 |
| 158 | 5314380 | 6834685620 |
| 159 | 5314361 | 6834685639 |
| 160 | 5314342 | 6834685658 |
| 161 | 5314323 | 6834685677 |
| 162 | 5314303 | 6834685697 |
| 163 | 5314284 | 6834685716 |
| 164 | 5314265 | 6834685735 |
| 165 | 5314245 | 6834685755 |
| 166 | 5314226 | 6834685774 |
| 167 | 5314207 | 6834685793 |
| 168 | 5314188 | 6834685812 |
| 169 | 5314168 | 6834685832 |
| 170 | 5314149 | 6834685851 |
| 171 | 5314130 | 6834685870 |
| 172 | 5314110 | 6834685890 |
| 173 | 5314091 | 6834685909 |
| 174 | 5314072 | 6834685928 |
| 175 | 5314053 | 6834685947 |
| 176 | 5314033 | 6834685967 |
| 177 | 5314014 | 6834685986 |
| 178 | 5313995 | 6834686005 |
| 179 | 5313976 | 6834686024 |
| 180 | 5313956 | 6834686044 |
| 181 | 5313937 | 6834686063 |
| 182 | 5313918 | 6834686082 |
| 183 | 5313899 | 6834686101 |
| 184 | 5313879 | 6834686121 |
| 185 | 5313860 | 6834686140 |
| 186 | 5313841 | 6834686159 |
| 187 | 5313822 | 6834686178 |
| 188 | 5313802 | 6834686198 |
| 189 | 5313783 | 6834686217 |
| 190 | 5313764 | 6834686236 |
| 191 | 5313745 | 6834686255 |
| 192 | 5313725 | 6834686275 |
| 193 | 5313706 | 6834686294 |
| 194 | 5313687 | 6834686313 |
| 195 | 5313668 | 6834686332 |
| 196 | 5313649 | 6834686351 |
| 197 | 5313629 | 6834686371 |
| 198 | 5313610 | 6834686390 |
| 199 | 5313591 | 6834686409 |
| 200 | 5313572 | 6834686428 |
| 201 | 5313553 | 6834686447 |
| 202 | 5313533 | 6834686467 |
| 203 | 5313514 | 6834686486 |
| 204 | 5313495 | 6834686505 |
| 205 | 5313476 | 6834686524 |
| 206 | 5313257 | 6834686543 |
| 207 | 5313437 | 6834686563 |
| 208 | 5313418 | 6834686582 |
| 209 | 5313399 | 6834686601 |
| 210 | 5313380 | 6834686620 |
| 211 | 5313361 | 6834686639 |
| 212 | 5313341 | 6834686659 |
| 213 | 5313322 | 6834686678 |
| 214 | 5313303 | 6834686697 |
| 215 | 5313284 | 6834686716 |
| 216 | 5313265 | 6834686735 |
| 217 | 5313246 | 6834686754 |
| 218 | 5313226 | 6834686774 |
| 219 | 5313207 | 6834686793 |
| 220 | 5313188 | 6834686812 |
| 221 | 5313169 | 6834686831 |
| 222 | 5313150 | 6834686850 |
| 223 | 5313131 | 6834686869 |
| 224 | 5313112 | 6834686888 |
| 225 | 5313092 | 6834686908 |
| 226 | 5313073 | 6834686927 |
| 227 | 5313054 | 6834686946 |
| 228 | 5313035 | 6834686965 |
| 229 | 5313016 | 6834686984 |
| 230 | 5312297 | 6834687003 |
| 231 | 5312978 | 6834687022 |
| 232 | 5312958 | 6834687042 |
| 233 | 5312939 | 6834687061 |
| 234 | 5312920 | 6834687080 |
| 235 | 5312901 | 6834687099 |
| 236 | 5312882 | 6834687118 |
| 237 | 5312863 | 6834687137 |
| 238 | 5312844 | 6834687156 |
| 239 | 5312825 | 6834687175 |
| 240 | 5312805 | 6834687195 |
| 241 | 5312786 | 6834687214 |
| 242 | 5312767 | 6834687233 |
| 243 | 5312748 | 6834687252 |
| 244 | 5312729 | 6834687271 |
| 245 | 5312710 | 6834687290 |
| 246 | 5312691 | 6834687309 |
| 247 | 5312672 | 6834687328 |
| 248 | 5312653 | 6834687347 |
| 249 | 5312634 | 6834687366 |
| 250 | 5312614 | 6834687386 |
| 251 | 5312595 | 6834687405 |
| 252 | 5312576 | 6834687424 |
| 253 | 5312557 | 6834687443 |
| 254 | 5312538 | 6834687462 |
| 255 | 5312519 | 6834687481 |

Thus for example, where P equals 100, the 5 MHz. signal input to divider 32 is divided by a total of 16228 resulting in an output approximately of 308 Hz. This signal of approximately 308 Hz. frequency, is compared internally within chip 34, by the phase comparator portion thereof, with a signal input from 12-bit divider chip 40 as will be hereinafter more fully explained. The output of the phase comparator portion of chip 34 is a signal dependent upon the respective frequencies and phases of the signals applied as inputs to the phase comparator. If both input signals have identical frequencies but different phases, the comparator output is either high or low depending upon the lag or lead phase relationship between those signals. If the input signals have different frequencies, the digital output signal is either high, low or zero depending upon the respective frequencies of those signals. As a result, variable capacitor 35 receives a slowly changing DC signal through a suitable RC network (see FIG. 3b) to control the frequency of the output signal of voltage controlled oscillator (VCO) 36. This signal's frequency is nominally approximately 5.315 MHz.

The VCO signal is applied to a digital mixer 38 comprising a flip flop such as one half of a 74LS74 dual flip flop chip. Digital mixer 38 also receives a 5 MHz. signal from divide-by-2 circuit 30 to produce an output signal having a frequency equal to the difference between the frequency of output of voltage controlled oscillator 36 and 5 MHz. or approximately 315 KHz. This 315 KHz. signal is applied to 12-bit divider 40 which, in the preferred embodiment, comprises a Motorola Model MC14040B 12-bit binary counter. The tenth-bit output of 12-bit divider 40 produces an output signal having a frequency which is equal to the input frequency divided by 1024, in this case approximately 308 Hz. This 308 Hz. signal is applied to the second input of the phase comparator within chip 34.

Accordingly, it will be observed that the phase comparator portion of chip 34, variable capacitor 35, oscillator 36, digital mixer 38 and 12-bit divider 40, form a closed phase lock loop which precisely controls the frequency of output voltage controlled oscillator 36 in accordance with a selected 8-bit program control code applied to bus 33 and input to programmable divider 32.

As shown in FIG. 2, the output of voltage controlled oscillator 36 is applied to a junction 42 to which the 90

MHz. output signal of frequency multiplier 26 is also applied. Junction 42 is then connected to the rubidium cell and multiplier 14 as indicated previously in conjunction with FIG. 1. It will be understood by those having skill in the art to which the present invention pertains that the application of the 5.315 MHz. output signal of voltage controlled oscillator 36 to a common junction with the output of the 90 MHz. signal of frequency multiplier 26, produces a 90 MHz. carrier amplitude modulated by the 5.315 MHz. voltage controlled oscillator signal. Thus, the 90 MHz. signal applied to the mutiplier snap diode of rubidium cell and multiplier 14, includes two sidebands, one above and one below the 90 MHz. signal and separated therefrom by the 5.315 MHz. frequency of the voltage controlled oscillator signal. It will be further recognized that as a result of the non-linear characteristics of the snap diode, a large number of harmonics are generated therein. In the embodiment disclosed herein, the lower sideband of the 76th harmonic, which is at a frequency equal to 76×90 MHz. minus 5.315 MHz., is, typically, equal to the resonance frequency of the rubidium cell.

As previously indicated, low frequency modulation is applied to the electromagnetic field resonance signal in order to vary the absorption characteristics of the rubidium cell so that photodiode 16 of FIG. 1 provides an indication of when resonance is in fact achieved. One novel aspect of the present invention is that this low frequency modulation signal is developed in the synthesizer 24. More specifically, the low frequency modulating signal is derived from the eleventh-bit output of 12-bit divider 40. The eleventh-bit output signal is, by necessity, at a frequency equal to one half the frequency of the tenth-bit output of 12-bit divider 40. Thus this modulation signal is also controlled by the aforementioned closed loop of synthesizer 24.

As shown in FIG. 2, this eleventh-bit output of divider 40, which is nominally at a frequency of approximately 154 Hz., is applied to a variable capacitor 41 through a suitable series resistor and parallel capacitor 40 to provide the frequency modulation voltage applied to voltage controlled oscillator 36. Thus the 5.315 MHz. signal output of voltage controlled oscillator 36 is frequency modulated by this loop-controlled 154 Hz. signal. Of course, the sideband of the 76th harmonic applied to the rubidium cell is also frequency modulated by this 154 Hz. signal to provide the aforementioned variation in rubidium cell absorptivity which is monitored by photodiode 16 (see FIG. 1). The 154 Hz. signal generated in frequency synthesizer 24 is also applied to synchronous phase detetor 20 of FIG. 1 as the reference signal to develop the DC error voltage for controlling the 10 MHz. voltage controlled crystal oscillator 22 as described previously in conjunction with FIG. 1.

Thus it is seen that there are a number of highly advantageous features provided by the frequency synthesizer of the present invention. For example, 8-bit program control of programmable divider 32 permits automated control of the offset frequency produced by the synthesizer over a range of approximately 5 KHz. in increments of less than 20 Hz. This control may be automated by connecting bus 33 to a suitable program device such as a general purpose computer. In addition, the fundamental modulating frequency applied to the electromagnetic field to produce a photodiode generated error signal, is produced in the synthesizer under loop control to assure stability and precise control thereof. In addition, to achieve this modulation of the electromagnetic field applied to the rubidium cell, the low frequency signal (i.e. 154 Hz.) directly frequency modulates a voltage controlled oscillator which, in turn, amplitude modulates the output of the frequency multiplier. Thus, direct frequency modulation significantly reduces the number of spurious modulated signals applied to the electromagnetic field in the rubidium cell. Furthermore, because frequency modulation and not phase modulation is utilized in the synthesizer of the invention, the difficulty of measuring and controlling the degree of phase modulation at the low frequency level is obviated. Additional highly advantageous features of the present invention reside in the particular detailed design thereof which will now be discussed in conjunction with FIGS. 3a and 3b.

Figure 3A:
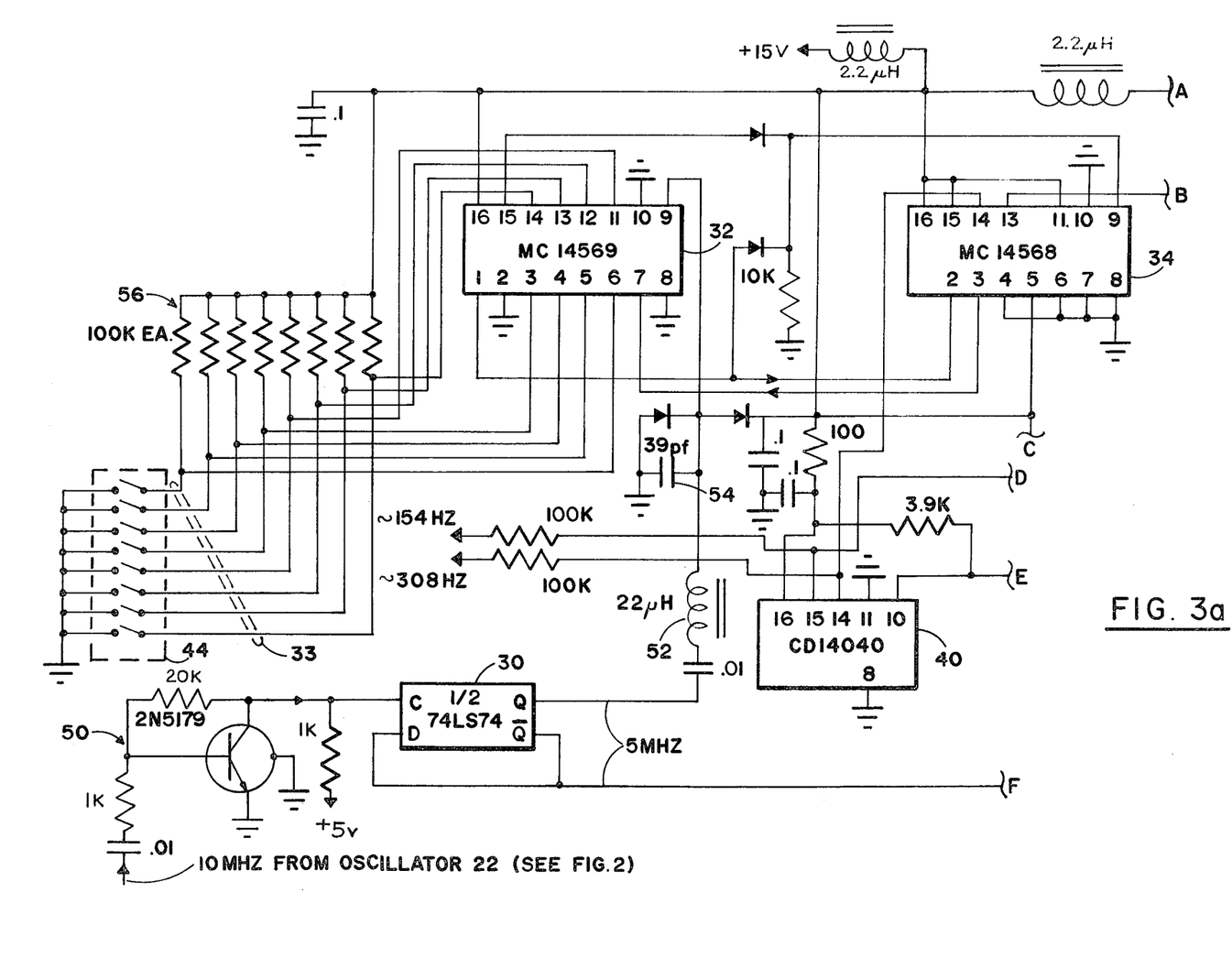
FIGS. 3a and 3b, is a detailed schematic diagram of the variable frequency synthesizer of the present invention.
Figure 3B:
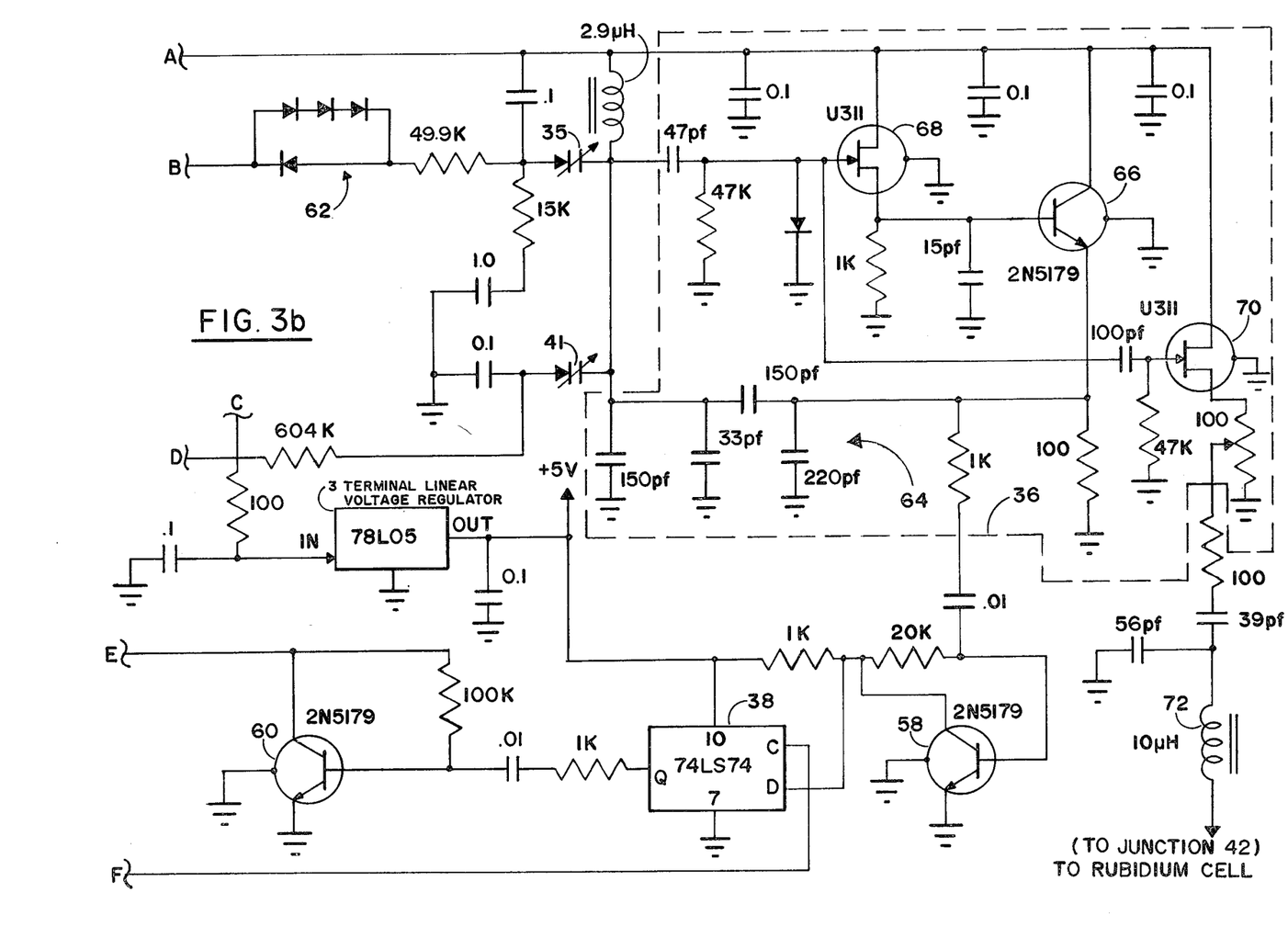

The schematic diagram of FIGS. 3a and 3b is provided herein as a complete disclosure of the frequency synthesizer of the present invention sufficient to enable those skilled in the art to which the invention pertains to make and use the invention without requiring more than mere routine skill to assemble the clearly identified components of FIGS. 3a and 3b. Accordingly, for purposes of brevity, only the major features of the invention as illustrated in FIGS. 3a and 3b shall now be described.

In FIG. 3a it is seen that the 10 MHz. frequency signal derived from voltage controlled crystal oscillator 22 is applied to grounded emitter transistor circuit 50 and then to the clock terminal of divide-by-2 flip flop 30. The output signals of divide-by-2 flip flop 30 at terminals Q and $\overline{Q}$, respectively, as is well known in the art, have a frequency of exactly one half of the frequency of the signal applied to the clock terminal. The Q output of flip flop 30 drives a series inductance 52 and a shunt capacitor 54 to drive the input terminal 9 of CMOS programmable divider chip 32. Inductor 52 combined with capacitor 54 and the input capacitance of the CMOS circuits, rings at 5 MHz. producing a level compatible with CMOS voltage requirements. As shown further in FIG. 3a, the 8-bit bus 33 for selecting the programmable divisor of divider 32 is connected to terminals 3, 4, 5, 6, 11, 12, 13 and 14 of divider 32 as well as to a plurality of 100 K.Ohm pull-up resistors 56 each of which are, in turn, connected to a 15 volt supply source. Although in the embodiment illustrated in FIG. 3a bus 33 is connected to a plurality of single pole switches on a single dip switch device 44, which is used to selectively apply logic signals to the program terminals of chip 32. It will be understood however that bus 33 may also be readily connected to a programmable device for automatically selecting the logic levels to be applied to the program terminals of chip 32 to automate the selection of the devisor of programmable divider 32. Thus the frequency offset generated by means of the invention may be controlled by a computer.

The remaining terminals of chip 32 not connected to either ground potential or the 15 volt supply source, are connected in appropriate arrangement to corresponding terminals of phase comparator and programmable counters circuit 34 to provide the total dividing factor of 16,128 plus P as described previously in conjunction with FIG. 2. The 5 MHz. signal available at the Q terminal of divide-by-2 flip flop 30 is divided by this factor and applied to a phase comparator internal to chip 34. The other input to the phase comparator within chip 34 is derived in the following manner. The 5 MHz. signal, available at the $\overline{Q}$ terminal of divide-by-2 flip flop 30, is applied to the clock terminal of flip flop 38 shown in FIG. 3b. Flip flop 38 may in fact be the remaining half of the same dual flip flop chip Model 74LS74 which comprises flip flop 30. The D terminal of flip flop 38 receives a signal output from voltage controlled oscillator circuit 36 through the grounded emitter transistor 58 at a frequency of approximately 5.315 MHz. as previously described in conjunction with FIG. 2.

As a result of the well known interaction of the clock and data terminal of a flip flop, the output signal at the Q terminal of flip flop 38 has a frequency equal to the difference between the frequencies of the respective signals applied to the clock and data terminals of that flip flop circuit. The mixed frequency output of digital mixer 38 available at the Q terminal thereof is applied through the grounded emitter transistor 60 to the clock terminal 10 of 12-bit binary counter 40 as disclosed previously in conjunction with FIG. 2.

The tenth-bit of chip 40, which provides an output having a frequency equal to the clock frequency divided by 1024 or approximately 308 Hz., is connected to terminal 14 of chip 34 which provides the second input to the tri-state phase comparator internal thereto. This 308 Hz. signal is also made available to the resonance detector portion of the rubidium standard (not shown). The output signal of the phase comparator located within chip 34 is available at terminal 13 thereof and applied to a plurality of diodes 62 and through a suitable RC network as a slowly changing DC voltage to variable capacitor 35. Variable capacitor 35 which may, by way of example be a Motorola Model MV2115, controls the basic output frequency of voltage controlled oscillator 36.

Similarly, the eleventh-bit of 12-bit divider chip 40, available at terminal 15 thereof, provides a signal at approximately 154 Hz. to a second variable capacitor 41, which may by way of example be a Motorola Model MV2101, as a frequency modulation input to voltage controlled oscillator 36. The peak-to-peak frequency deviation of oscillator 36 induced by the 154 Hz. modulating signal, is controlled by capacitor network 64 connected in the feedback loop of the oscillator between the emitter of bipolar transistor 66 and the gate of FET 68. The main output of voltage controlled oscillator 36 is available at the source terminal of FET 70 through a suitable impedance matching network including RF choke 72 where it is applied to junction 42 previously disclosed in conjunction with FIG. 2 for application with the 90 MHz. output of frequency multiplier 26 to the rubidium cell. It is to be noted that the eleventh-bit at terminal 15 of 12-bit divider 40 also provides a 154 Hz. signal as a reference input to synchronous phase detector 20 as disclosed previously in conjunction with FIG. 1.

It will now be understood that what has been disclosed herein is an improved variable frequency synthesizer primarily for use in conjunction with a rubidium frequency standard. It provides high resolution and wide range digitally controlled frequency increments for precise frequency control to compensate for variations in rubidium cell frequency resonance. A number of novel features of the invention have been disclosed herein including the provision for directly frequency modulating the voltage controlled oscillator of the synthesizer by a stable phase lock loop generated modulating frequency which may also be used as the phase reference signal to stabilize a crystal oscillator to the rubidium vapor atomic clock. The reliability is improved and cost and size are substantially reduced by employing a number of novel circuit concepts including the use of ringing circuits as passive TTL to CMOS level converters. A particularly advantageous aspect of the present invention comprises a program controllable frequency dividing feature which permits automated control of time scale changes of an atomic clock for synchronizing atomic time with earth time.

Although a particular preferred embodiment of the invention has been disclosed herein, it will be understood by those having skill in the art to which the present invention pertains, that many modifications and additions may be made hereto without deviating from the applicant's teaching. By way of example, particular frequencies specified herein may be changed as needed to accommodate other applications not necessarily related to atomic clock use and/or other frequency preferences for atomic clocks dictated by user requirements. By way of further example, the particular range in resolution of the frequency offset increments of the synthesizer of the present invention may be readily modified to provide even greater range and smaller increments if desired, while still controllable as a programmed automated input as herein disclosed.

Accordingly, it will be understood that all such modifications and additions are contemplated to be within the scope of the present invention which is to be limited only by the appended claims.

I claim:

1. An adjustable frequency synthesizer for receiving an input signal of a first frequency and for generating a carrier signal of a second frequency, the second frequency being offset from the first frequency by a selected offset frequency, comprising:

a programmable frequency divider having an input for receiving a signal derived from said input signal and operating therefrom a first divided signal having a frequency equal to said first frequency divided by a number selected in accordance with a programmed code applied to said programmable frequency divider, a phase comparator connected to said programmable frequency divider for receiving said first divided signal, said phase comparator having means for comparing the frequency and phase of said first divided signal with the frequency and phase of a second divided signal and for generating a control signal by means of said comparing, a controllable oscillator connected to said phase comparator for receiving said control signal and having means for generating at an output said carrier signal with a frequency determined in accordance with the magnitude of said control signal, a mixer connected to the input of said programmable frequency divider and to the output of said controllable oscillator for receiving said signal derived from said input signal and at least said carrier signal, said mixer having means for generating a difference signal having a frequency equal to said selected offset frequency, a fixed frequency divider connected to said mixer for receiving said difference signal and having means for generating said second divided signal with a frequency equal to said offset frequency divided by a fixed number, said fixed frequency divider including means for generating a third divided signal having a frequency equal to one half of the frequency of said second divided signal, said fixed frequency divider being connected to said phase comparator for applying said second divided signal to said phase comparator, and said fixed frequency divider being connected to said controllable oscillator for frequency modulating said carrier signal with said third divided signal, whereby said offset frequency is selected in accordance with and controlled by said programmed code.

2. The adjustable frequency synthesizer of claim 1 further comprising a frequency multiplier to which said input signal of said first frequency is applied to produce an output of multiplied frequency, said output of multiplied frequency being connected to the output of said controllable oscillator whereby said carrier signal amplitude modulates said multiplied frequency.

3. The adjustable frequency synthesizer of claim 1, wherein said input signal is the output of a crystal controlled oscillator stabilized by an atomic frequency resonator, and wherein said carrier signal is used to derive the quantum mechanical transition resonance frequency of said resonator.

4. The adjustable frequency synthesizer recited in claim 3, wherein said atomic frequency resonator is a rubidium vapor cell optically pumped by a rubidium-lamp-generated light beam.

5. The adjustable frequency synthesizer recited in claim 4, wherein said first frequency is a multiple of 5 MHz. and wherein said second frequency is in the range of 5.312519 MHz. to 5.317460 MHz.

6. The adjustable frequency synthesizer recited in claim 4, wherein said selected number in said programmable frequency divider is in the range of 0 to 255, inclusive and wherein said programmed code is an 8-bit binary representation of said number.

7. The adjustable frequency synthesizer recited in claim 6, wherein the quantum mechanical transition resonance frequency ($fr$) of said resonator is related to said second frequency ($fs$) in accordance with the following relationship:

$$fr = 6,840 \text{ MHz.} - fs.$$

8. The adjustable frequency synthesizer recited in claims 1, 3, 4, 5, 6, or 7 wherein said programmed code is input by manually operated switches.

9. The adjustable frequency synthesizer recited in claims 1, 3, 4, 5, 6, or 7 wherein said programmed code is input by a programmed apparatus.

10. The adjustable frequency synthesizer recited in claims 1, 3, 4, 5, 6, or 7 in which said programmable frequency divider, said phase comparator, and said fixed frequency divider are CMOS devices, and wherein said mixer is a TTL device.

11. In an atomic frequency standard of the type used for stabilizing a frequency source by tracking it to a hyperfine transition resonance of an atomic frequency resonator having a photodiode for detecting resonance, a phase detector for generating an oscillator control signal in response to the photodiode output signal, a first controlled oscillator frequency source having an output signal whose frequency is controlled by the control signal generated by the phase detector, and means interconnecting the frequency source and the resonator for generating an electromagnetic field for application to the resonator with a field frequency dependent on the frequency of the frequency source, the interconnecting means comprising a frequency multiplier and an improved adjustable frequency synthesizer, the improved synthesizer comprising:

a programmable frequency divider connected to said frequency source for receiving said frequency source output signal and generating therefrom a first divided signal having a frequency equal to the frequency of said frequency source divided by a number selected in accordance with a programmed code, a phase comparator connected to said programmable frequency divider for receiving said first divided signal for comparing the frequency and phase thereof with the frequency and phase of a second divided signal and for generating a second control signal by means of said comparing, a second controllable oscillator connected to said phase comparator for receiving said second control signal and having means for generating a resonance related signal having a frequency determined in accordance with the magnitude of said second control signal, a mixer connected to receive said resonance related signal of said second controllable oscillator and to receive said output signal of said frequency source for generating a difference periodic signal having a frequency equal to the difference between the frequencies of said output signal of said frequency source and said resonance related signal, a fixed frequency divider connected to said mixer for receiving said difference periodic signal and having means for generating said second divided signal with a frequency equal to the frequency of said difference periodic signal divided by a fixed number, said fixed frequency divider including means for generating a third divided signal having a frequency equal to one half of the frequency of said second divided signal, said fixed frequency divider being connected to said phase comparator for applying said second divided signal to said phase comparator, said fixed frequency divider being further connected to said second controllable oscillator for frequency modulating said resonance related signal with said third divided signal, whereby said resonance related signal frequency is selected in accordance with and controlled by said programmed code, and means summing said resonance related signal with the output signal of said frequency multiplier for generating said electromagnetic field.

12. The improved synthesizer recited in claim 11 wherein said atomic frequency resonator is a rubidium vapor cell optically pumped by a rubidium-lamp-generated light beam.

13. The improved frequency synthesizer recited in claim 12 wherein said source frequency is a multiple of 5 MHz. and wherein said resonance related signal frequency is in the range of 5.312519 MHz. to 5.317460 MHz.

14. The improved frequency synthesizer recited in claim 12, wherein said selected number in said programmable frequency divider is in the range of 0 to 255, inclusive, and wherein said programmed code is in an 8-bit binary representation of said number.

15. The improved frequency synthesizer recited in claim 12, wherein the quantum mechanical transition resonance frequency ($fr$) of said resonator is related to said resonance related frequency ($fs$) in accordance with the following relationship:

$f_r = 6,840 \text{ MHz.} - f_s.$

16. The improved frequency synthesizer recited in claims 11, 12, 13, 14, or 15, wherein said programmed code is input by manually operated switches.

17. The improved frequency synthesizer recited in claims 11, 12, 13, 14, or 15, wherein said programmed code is input by a preprogrammed apparatus.

18. The improved frequency synthesizer recited in claims 11, 12, 13, 14, or 15 in which said programmable frequency divider, said phase comparator, and said fixed frequency divider are CMOS devices, and wherein said mixer is a TTL device.

19. An adjustable frequency synthesizer for receiving a signal derived from an input signal of a first frequency and for generating a carrier signal of a second frequency, the second frequency being offset from the first frequency by a selected offset frequency, comprising:

means for generating a reference signal having a frequency equal to said first frequency divided by a number selected in accordance with a programmed code, voltage controlled means for generating said carrier signal, means connected to said voltage controlled means for generating a signal at said offset frequency, means connected to said offset frequency signal generating means for generating a signal having a frequency at a fixed submultiple of said offset frequency, and for generating a signal having a frequency of one-half of the frequency of said fixed submultiple for application to said voltage controlled means for frequency modulating said carrier signal, and means connected to said submultiple frequency signal generating means for comparing the relative phases and frequencies respectively of said reference signal and said submultiple frequency signal and for generating a control voltage by means of said comparing for control of said voltage controlled means.

20. The adjustable frequency synthesizer of claim 19 further comprising a frequency multiplier to which said input signal of said first frequency is applied to produce an output of multiplied frequency, said output of multiplied frequency being connected to the output of said controllable oscillator whereby said carrier signal amplitude modulates said multiplied frequency.

* * * * *